US007133194B1

(12) United States Patent
Kwon et al.

(10) Patent No.: US 7,133,194 B1
(45) Date of Patent: Nov. 7, 2006

(54) WAVELENGTH TUNABLE LIGHT SOURCE INTEGRATED WITH OPTICAL AMPLIFIER, BEAM STEERING UNIT, AND CONCAVE DIFFRACTION GRATING

(75) Inventors: Oh Kee Kwon, Daejeon (KR); Kang Ho Kim, Daejeon (KR); Kwang Ryong Oh, Daejeon (KR); Jong Hoi Kim, Daejeon (KR); Eun Deok Sim, Daejeon (KR); Hyun Soo Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 11/388,522

(22) Filed: Mar. 24, 2006

(30) Foreign Application Priority Data

Jul. 2, 2005 (KR) .................. 10-2005-0059490
Dec. 15, 2005 (KR) .................. 10-2005-0124176

(51) Int. Cl.
*H01S 3/13* (2006.01)
(52) U.S. Cl. .................. 359/337.21; 372/32
(58) Field of Classification Search .......... 354/333, 354/337.21; 372/20, 32
See application file for complete search history.

(56) References Cited

U.S. PATENT DOCUMENTS 5,970,082 A * 10/1999 Ershov ............... 372/102
6,125,223 A * 9/2000 Drozdowicz ............ 385/37
2005/0286570 A1* 12/2005 Xiang ................. 372/20

FOREIGN PATENT DOCUMENTS

KR 1020030049475 A 6/2003

OTHER PUBLICATIONS

M. Kourogi et al., "Continuous tuning of an electrically tunable external-cavity semiconductor laser", Aug. 15, 2000/vol. 25, No. 16/ Optics Letters (2000 Optical Society of America) (pp. 1165-1167).
Oh Kee Kwon et al., "Proposal of Electrically Tunable External-Cavity Laser Diode", IEEE Photonics Technology Letters, vol. 16, No. 8, Aug. 2004 (pp. 1804-1806).
D. A. May-Arrioja et al., "Optical Beam Steering Using InGaAsP Multiple Quantum Wells", IEEE Photonics Technology Letters, vol. 17, No. 2, Feb. 2005 (pp. 333-335).
Yan Sun et al., "Thermally Controlled Lateral Beam Shift and Beam Steering in Semiconductor Lasers", IEEE Photonics Technology Letters, vol. 7, No. 1, Jan. 1995 (pp. 26-28).

* cited by examiner

*Primary Examiner*—Mark Hellner
(74) *Attorney, Agent, or Firm*—Blakely Sokoloff Taylor & Zafman

(57) ABSTRACT

Provided is a wavelength tunable light source that can electrically tune wavelengths by monolithically integrating an optical amplifier, a beam steering unit, and a concave diffraction grating on a single substrate. A beam is deflected by the beam steering unit when an electrical signal is applied to two electrodes installed in the beam steering unit to be incident on the diffraction grating, and then diffracted by the diffraction grating according to the incidence angle such that part of the beam with a specific wavelength is reflected, thereby achieving wavelength tuning. Since the wavelength tuning is achieved electrically, the wavelength tunable light source is structurally stable and has a rapid wavelength tuning rate.

13 Claims, 9 Drawing Sheets

WAVELENGTH TUNABLE LIGHT SOURCE INTEGRATED WITH OPTICAL AMPLIFIER, BEAM STEERING UNIT, AND CONCAVE DIFFRACTION GRATING

CROSS-REFERENCE TO RELATED PATENT APPLICATION

This application claims the benefit of Korean Patent Application Nos. 10-2005-0059490, filed on Jul. 2, 2005 and 10-2005-0124176, filed on Dec. 15, 2005, in the Korean Intellectual Property Office, the disclosures of which are incorporated herein in their entirety by reference.

BACKGROUND OF THE INVENTION

1. Field of the Invention

The present invention relates to a wavelength tunable light source, and more particularly, to a wavelength tunable light source that can electrically tune wavelengths by integrating an optical amplifier, a beam steering unit, and a concave diffraction grating on a single substrate.

2. Description of the Related Art

In general, the use of wavelength tunable semiconductor lasers, i.e., wavelength tunable light sources is becoming more important with the advent of optical transmission technology such as wavelength division multiplexing (WDM). Since wavelength tunable semiconductor lasers have many compelling advantages over fixed wavelength lasers that emit respective different wavelengths, the wavelength tunable semiconductor lasers can be a good substitute for the fixed wavelength lasers. Particularly, wavelength tunable semiconductor lasers are used very effectively in reconfigurable optical add/drop multiplexing (ROADM), fast packet switching over all optical networks, wavelength converting, wavelength routing, etc. Besides, those wavelength tunable semiconductor lasers are extensively used in optical sensing, medical treatment, and measurement applications. Accordingly, many of the world's leading companies have reported various types of wavelength tunable semiconductor lasers. An external-cavity wavelength tunable semiconductor laser among conventional wavelength tunable semiconductor lasers will now be explained for clear understanding of the present invention.

Figure 1:
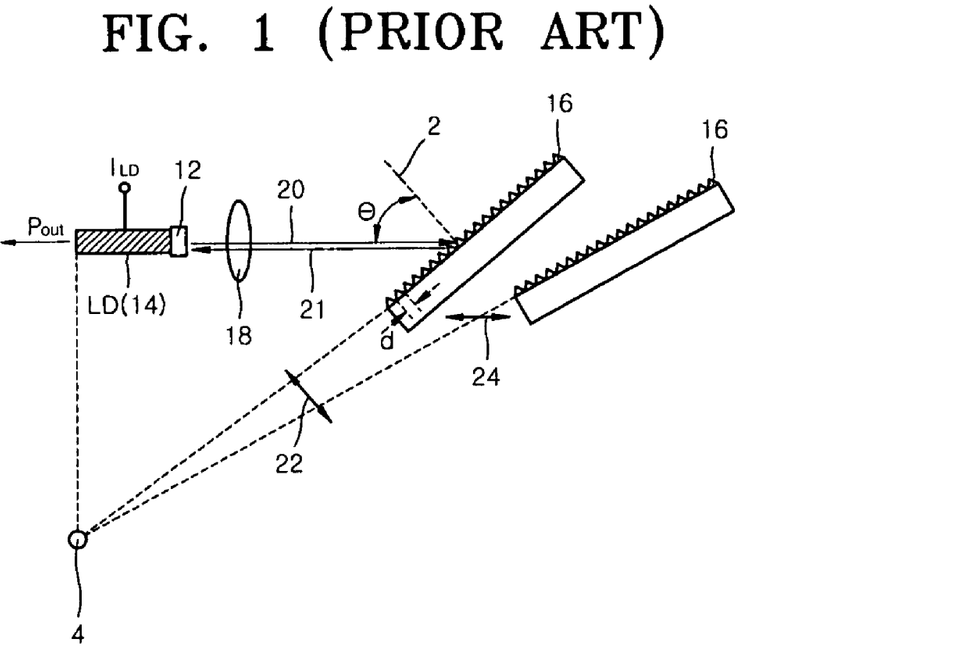
FIG. 1 is a schematic view of a conventional external-cavity wavelength tunable light source in Littrow configuration.

FIG. 1 is a schematic view of a conventional external-cavity wavelength tunable light source in Littrow configuration.

In detail, the conventional external-cavity wavelength tunable light source includes a semiconductor laser, e.g., a laser diode (LD), 14 coated with an anti-reflection film 12, an external diffraction grating 16, and a lens 18. The semiconductor laser 14 can produce a beam 20 using current $I_{LD}$ applied thereto. When the beam 20 produced by the semiconductor laser 14 and passing through the lens 18 reaches the external diffraction grating 16, the beam 20 is diffracted at an angle θ between the beam 20 entering the diffraction grating 16 and a line 2 perpendicular to the plane of the diffraction grating 16. According to the following diffraction grating equation 1 for the Littrow configuration, the wavelength of the diffracted beam 21 is determined, and only a beam 21 with a specific wavelength is fed back to the semiconductor laser 14 to output light $P_{out}$.

$$m\lambda = 2d \sin \theta \qquad (1)$$

where m is the diffraction order, λ is the wavelength, d is the period of the diffraction grating 16, and θ is the incidence angle.

When the diffraction grating 16 is rotated in a first direction 22 about a pivot point 4, which is a virtual intersection point between the extension line of a left surface of the semiconductor laser 14 and the extension line of the plane of the diffraction grating 16, the incidence angle θ is changed and the wavelength is also changed according to Equation 1. If the incidence angle θ alone is changed in the above structure, the wavelength has a step-like shift disadvantageously. Accordingly, to achieve continuous wavelength tuning, the diffraction grating 16 should be translated in a second direction 24 as well.

In other words, the conventional external-cavity wavelength tunable light source of FIG. 1 can achieve continuous wavelength tuning by changing the diffraction condition through the displacement, that is, rotation and translation, of the diffraction grating 16 about the pivot point 4. The conventional external-cavity wavelength tunable light source of FIG. 1 has the advantages of high output power, narrow linewidth, and wide tuning range, and thus is now widely used for measurement equipment.

However, the external-cavity wavelength tunable light source has problems in that it is difficult to properly align the semiconductor laser 14 and the diffraction grating 16, mechanical vibration occurs during the displacement of the diffraction grating 16, and a wavelength shift is caused by a change in the position of the pivot point 4 with aging. In particular, since the external-cavity wavelength tunable light source of FIG. 1 has a very slow wavelength tuning rate, it is difficult to be applied to optical communication systems and various application systems.

Figure 2:
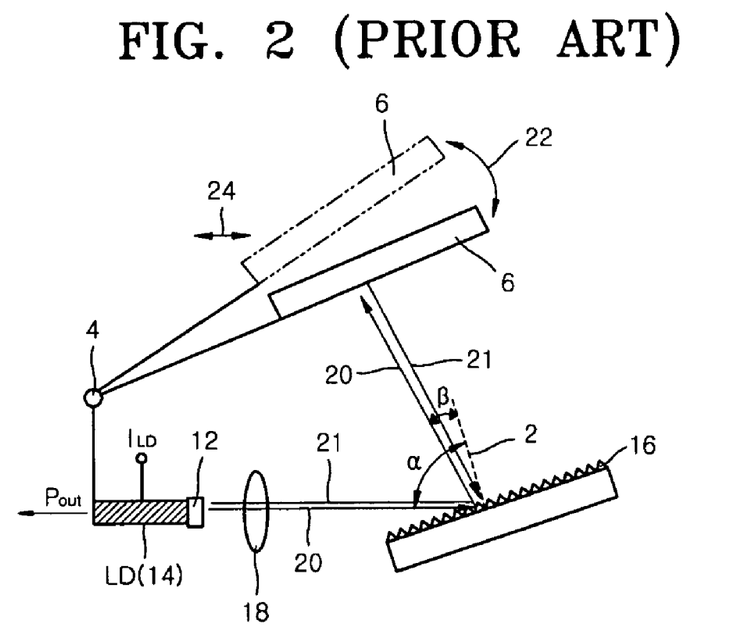
FIG. 2 is a schematic view of a conventional external-cavity wavelength tunable light source in Littman configuration.

FIG. 2 is a schematic view of another conventional external-cavity wavelength tunable light source in Littman configuration.

In detail, the conventional wavelength tunable light source includes a semiconductor laser, e.g., an LD, 14 coated with an anti-reflection film 12, an external diffraction grating 16, a lens 18, and a reflective mirror 6. The semiconductor laser 14 produces a beam 20 using a current applied thereto. When the beam 20 produced by the semiconductor laser 14 and passing through the lens 16 and the diffraction grating 16 reaches the reflective mirror 6, only part 21 of the beam 20 which is perpendicularly incident on the reflective mirror 6 is reflected back to the diffraction grating 16. The reflected beam 21 passes through the diffraction grating 16 and the lens 18 and is fed back to the semiconductor laser 14 to output light $P_{out}$. The beam 20 is diffracted at an angle α between the beam incident on the diffraction grating 16 and a line 2 perpendicular to the plane of the diffraction grating 16 and the reflected beam 21 is diffracted at an angle β between the beam 20 diffracted by the external diffraction grating 16 and the perpendicular line 2 according to the following diffraction grating equation 2 for the Littman condition.

$$m\lambda = d(\sin \alpha + \sin \beta) \qquad (2)$$

where m is the diffraction order, λ is the wavelength, d is the period of the diffraction grating 16, α is the incidence angle, and β is the diffraction angle.

When the reflective mirror 6 is rotated in a first direction 22 about a pivot point 4, the diffraction angle β is changed while the incidence angle α is fixed, and the wavelength is also changed according to Equation 2. If the diffraction angle β alone is changed in the above structure, the wavelength has a step-like shift disadvantageously. Accordingly, in order to achieve continuous wavelength tuning, the reflective mirror 6 should be translated 24 in a second direction 24 as well.

In other words, the conventional external-cavity wavelength tunable light source of FIG. 2 can achieve continuous wavelength tuning by changing the diffraction condition through the displacement, that is, rotation and translation, of the diffraction grating 16 about the pivot point 4. The conventional external-cavity wavelength tunable light source of FIG. 2 is structurally more stable than the conventional external-cavity wavelength tunable light source of FIG. 1 since the diffraction grating 16 is fixed and only the reflective mirror 6 is moved during the wavelength tuning.

However, like the conventional wavelength tunable light source of FIG. 1, the external-cavity wavelength tunable light source of FIG. 2 has problems in that it is difficult to properly align the semiconductor laser 14 and the diffraction grating 16, mechanical vibration occurs during the displacement of the reflective mirror 6, and a wavelength shift is caused by a change in the position of the pivot point 4 with aging. Further, since the external-cavity wavelength tunable light source of FIG. 2 has a very slow wavelength tuning rate, it is difficult to be applied to optical communication systems and various application systems.

To increase the slow wavelength tuning rate of the conventional external-cavity wavelength tunable light sources of FIGS. 1 and 2, structures for electrically tuning wavelengths have been suggested. For example, in "Continuous tuning of an electrically tunable external-cavity semiconductor", Optics Letters, Vol. 25, No. 16, pp. 1165–1167, Aug. 15, 2000, reported by M. Kourogi et al., a method of achieving wavelength tuning based on beam deflection according to the frequency of an external electrical signal by inserting an Acouto-optic modulator (AOM) between a laser diode and a diffraction grating instead of by moving the diffraction grating for wavelength tuning was suggested. However, the invention disclosed by M. Kourogi et al. has problems in that the AOM is large in size, insertion loss is huge, and a wavelength tuning variation is limited to 2 nm at most.

In short, the conventional wavelength tunable light sources for tuning the wavelength through the displacement of the diffraction grating have limitations in reliability and speed. The conventional bulk wavelength tunable light source for electrically tuning the wavelength has the problems of difficult alignment between the diffraction grating and the laser diode and large size due to the insertion of the AOM.

SUMMARY OF THE INVENTION

The present invention provides a wavelength tunable light source that can make additional optical elements or optical alignment unnecessary by monolithically integrating bulk optical elements.

The present invention also provides a wavelength tunable light source that can prevent discontinuous wavelength tuning caused by beam deflection, which is confronted by a conventional external-cavity wavelength tunable light source employing an optical deflector, increase output power by reducing light loss, and decrease output power variation.

The present invention also provides a wavelength tunable light source that can improve the reliability of the device by simplifying manufacturing processes.

According to an aspect of the present invention, there is provided a wavelength tunable light source comprising: an optical amplifier amplifying and outputting a beam; a beam steering unit moving the path of the beam output from the optical amplifier in response to an electrical signal; and a concave diffraction grating diffracting the beam passing through the beam steering unit and incident thereon according to the incidence angle of the beam and reflecting part of the beam with a specific wavelength, wherein the path of the beam produced by the optical amplifier is changed by the beam steering unit when the electrical signal is applied to the beam steering unit to be incident on the concave diffraction grating, and then diffracted and reflected by the concave diffraction grating such that only the part of the beam with the specific wavelength is fed back to the beam steering unit and the optical amplifier, thereby achieving wavelength tuning.

According to another aspect of the present invention, there is provided a wavelength tunable light source comprising: a first optical amplifier amplifying and outputting a beam; a beam steering unit moving the path of the beam output from the first optical amplifier in response to an electrical signal; a concave diffraction grating diffracting the beam passing through the beam steering unit and incident thereon according to the incidence angle of the beam such that only part of the beam with a specific or plurality of wavelengths is reflected; and a second optical amplifier, i.e., an optical waveguide, outputting the beam with the specific or plurality of wavelengths reflected by the concave diffraction grating, wherein the path of the beam produced by the optical amplifier is changed by the beam steering unit when the electrical signal is applied to the beam steering unit to be incident on the concave diffraction grating, and then diffracted and reflected by the concave diffraction grating such that only the part of the beam with the specific or plurality of wavelengths is fed back to the first optical amplifier through the beam steering unit or fed back to the second optical amplifier, or an optical waveguide, thereby achieving wavelength tuning.

According to still another aspect of the present invention, there is provided a wavelength tunable light source comprising: an optical amplifier amplifying and outputting a beam; a beam steering unit moving the path of the beam output from the optical amplifier in response to an electrical signal; and a concave diffraction grating that is formed in Rowland circle, and diffracts and reflects the beam passing through the beam steering unit and incident thereon according to the incidence angle of the beam such that part of the beam with a specific wavelength is reflected, wherein the path of the beam produced by the optical amplifier is changed by the beam steering unit when the electrical signal is applied to the beam steering unit to be incident on a pole of the concave diffraction grating where a full circle formed around the concave diffraction grating and the Rowland circle intersect, and then diffracted and reflected by the concave diffraction grating such that only the part of the beam with the specific wavelength is fed back through the beam steering unit to the optical amplifier, thereby achieving wavelength tuning according to a diffraction grating equation for the Littrow condition.

According to yet another aspect of the present invention, there is provided a wavelength tunable light source comprising: a first optical amplifier amplifying and outputting a beam; a beam steering unit moving the path of the beam output from the first optical amplifier in response to an electrical signal; a concave diffraction grating that is formed in Rowland circle and diffracts the beam passing through the beam steering unit and incident thereon according to the incidence angle of the beam such that part of the beam with a specific or plurality of wavelengths is reflected; and a second optical amplifier, i.e., an optical waveguide, outputting the beam with the specific or plurality of wavelengths reflected by the concave diffraction grating, wherein the path of the beam produced by the optical amplifier is changed by the beam steering unit when the electrical signal is applied to the beam steering unit to be incident on a pole of the concave diffraction grating where a full circle formed around the concave diffraction grating and the Rowland circle intersect, and then diffracted and reflected by the concave diffraction grating such that only the part of the beam with the specific or plurality of wavelengths is fed back to the first optical amplifier through the beam steering unit to achieve wavelength tuning or fed back to the second optical amplifier or an optical waveguide to achieve wavelength tuning according to a diffraction grating equation for the Littman condition.

Since the wavelength tunable light source electrically tunes the wavelength, it is structurally stable and has a fat wavelength tuning rate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The same elements are given the same reference numerals throughout the drawings.

Figure 3A:
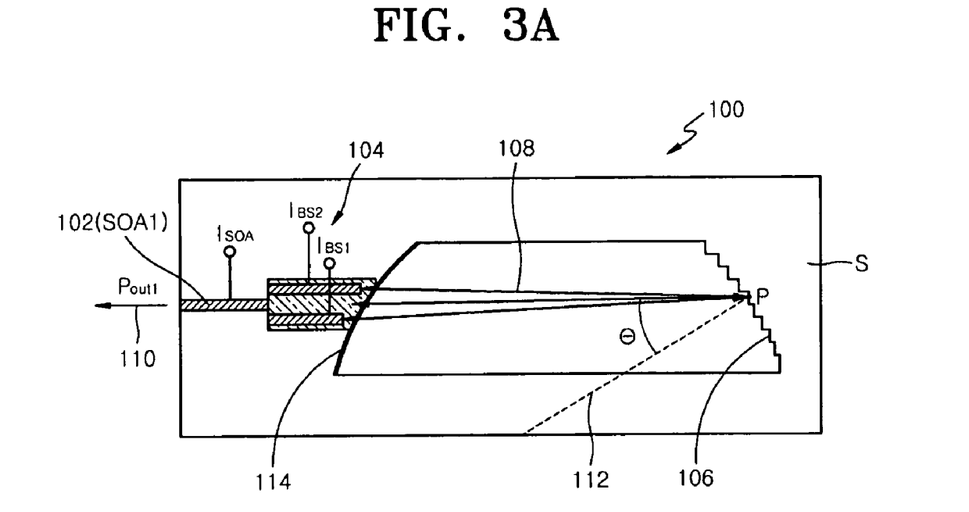
FIGS. 3A and 3B are schematic views of a wavelength tunable light source according to an embodiment of the present invention.
Figure 3B:
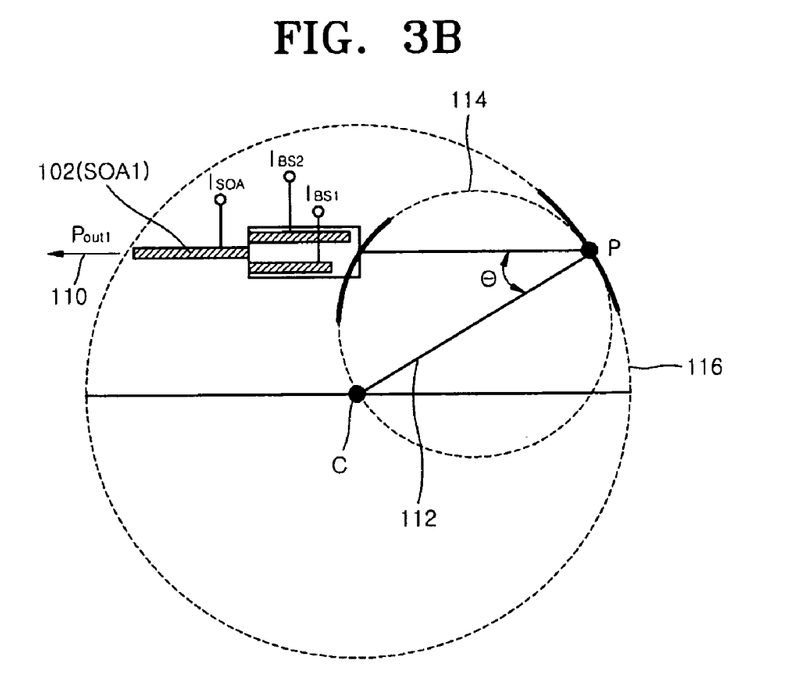

FIGS. 3A and 3B are schematic views of a wavelength tunable light source according to an embodiment of the present invention. In detail, the wavelength tunable light source, i.e., a wavelength tunable laser, 100 of FIGS. 3A and 3B is configured to satisfy the Littrow condition.

The wavelength tunable light source 100 illustrated in FIG. 3A is monolithically integrated with a semiconductor optical amplifier (SOA or SOA1) 102, a beam steering unit 104, and a concave diffraction grating 106 on a semiconductor substrate S, for example, an InP substrate. The SOA 102 may be a semiconductor laser diode, and current $I_{SOA}$ may be applied to the SOA 102. The beam steering unit 104 includes two electrodes, and electrical signals, for example, current $I_{BS1}$ and current $I_{BS2}$, may be applied to the two electrodes. The concave diffraction grating 106 is disposed on a side of the semiconductor substrate S. The concave diffraction grating 106 is realized by manufacturing a grating on a side of the substrate S.

The concave diffraction grating 106 is not limited to a specific construction, but is configured in the form of Rowland circle 114 for explanation. FIG. 3B illustrates the concave diffraction grating 106 in the Rowland circle 114. A pole P denotes an intersection point between a full circle 116 formed around the concave diffraction grating 106 and the Rowland circle 114, and a reference line 112 denotes a straight line between the center C of the circle 116 of the concave diffraction grating 106 and the pole P. The beam steering unit 104 contacts a side of the Rowland circle 114.

Referring to FIG. 3A, since a left side of the SOA 102 and the concave diffraction grating 106 have reflective surfaces, the SOA 102 and the concave diffraction grating 106 function as both resonators and laser diodes. A beam 108 emitted from the SOA 102 toward the diffraction grating 106 passes through the beam steering unit 104 and then reaches the pole P of the concave diffraction grating 106. The beam 108 incident on the concave diffraction grating 106 is diffracted by the concave diffraction grating 106 and only part 110 of the beam 108 with a specific wavelength is fed back to the SOA 102 at the same angle as an incidence angle θ to output light $P_{out}$. The specific wavelength is determined by the following diffraction grating equation 3 for the Littrow condition.

$$m\lambda = 2n_1 d \sin\theta \qquad (3)$$

where m is the diffraction order, λ is the wavelength, $n_1$ is the refractive index of a waveguide layer, d is the period of the concave diffraction grating 106, and θ is the incidence angle between the path of the beam incident on the concave diffraction grating 106 and the reference line 112 as shown in FIGS. 3A and 3B.

In particular, the beam steering unit 104 includes two electrodes thereinside, and can steer the pat of the beam by controlling a difference between the amounts of current applied to the two electrodes. Accordingly, the angle of the beam 108 incident on the concave diffraction grating 106 differs from the original incidence angle θ. As the incidence angle θ is changed, the wavelength of the diffracted beam 108 also differs from the original wavelength λ according to Equation 3.

Figure 4:
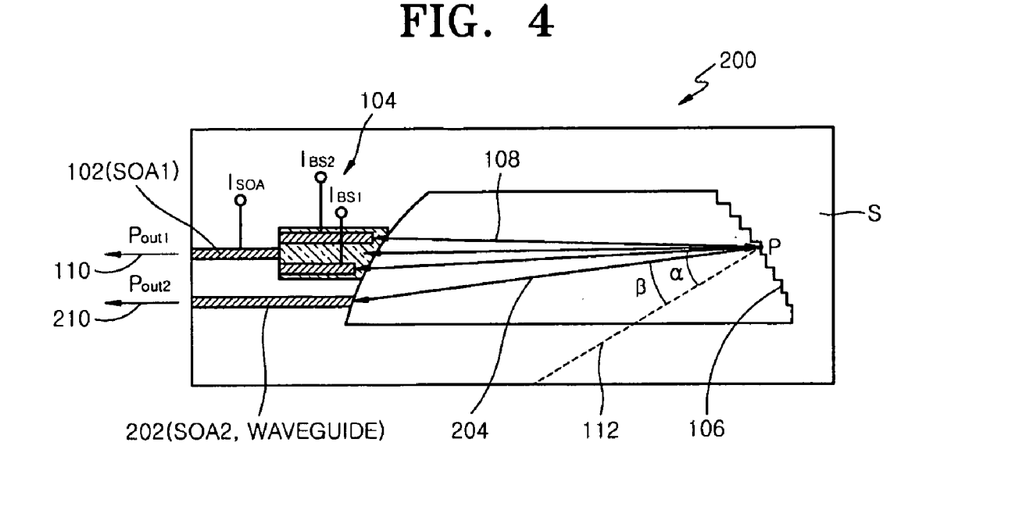
FIG. 4 is a schematic view of a wavelength tunable light source according to another embodiment of the present invention.

FIG. 4 is a schematic view of a wavelength tunable light source according to another embodiment of the present invention.

In detail, the wavelength tunable light source, i.e., a wavelength tunable laser, 200 of FIG. 4 is configured to satisfy the Littman condition. Although the wavelength tunable light source 200 of FIG. 4 has a similar structure to that of the wavelength tunable light source 100 of FIG. 3, the wavelength tuning of the wavelength tunable light source 200 of FIG. 4 is determined by the following diffraction grating equation 4 for the Littman condition.

$$m\lambda = 2n_1 d(\sin \alpha + \sin \beta) \quad (4)$$

where m is the diffraction order, $\lambda$ is the wavelength, $n_1$ is the refractive index of a waveguide layer, d is the period of the diffraction grating, $\alpha$ is the angle between a beam 108 incident on the concave diffraction grating 106 and the reference line 112 extending from the center of the circle of the concave diffraction grating 106 to the pole P, and $\beta$ is a diffraction angle $\beta$ between the reference line 112 and a beam 204 reflected to a second optical amplifier SOA2 (or an optical waveguide) 202.

Referring to FIG. 4, the incidence angle $\alpha$ is changed due to moving the path of beam during current injection to the beam steering unit 104 while the diffraction angle $\beta$ is fixed, thereby achieving wavelength tuning. Specifically, a beam 108 emitted from a first optical amplifier SOA1 passes through the beam steering unit 104 and then is incident on the concave diffraction grating 106. Thereafter, the beam 108 is diffracted by the concave diffraction grating 106 and only part 204 of the beam 108 with a specific wavelength is fed back to the second optical amplifier SOA2 202 at the diffraction angle $\beta$ to output light $P_{out2}$ 210. Since a left side of the first optical amplifier SOA1 102 and a left side of the second optical amplifier SOA2 202 have reflective surfaces in the above structure, the first and second optical amplifiers SOA1 102 and SOA2 202 function as both resonators and laser diodes.

Although the wavelength tunable light source 200 of FIG. 4 additionally includes the second optical amplifier SOA2 202 for guiding or amplifying the beam 204 that is diffracted at the diffraction angle $\beta$ by the concave diffraction grating 106 compared to the wavelength tunable light source 100 of FIG. 3, the wavelength tunable light source 200 of FIG. 4 can ensure more stable operation and wider selection. The wavelength tunable light source 200 of FIG. 4 includes two optical power terminals for the first optical amplifier 102 and the second optical amplifier 202 whereas the wavelength tunable light source 100 of FIG. 3 includes only one output power terminal.

Figure 5:
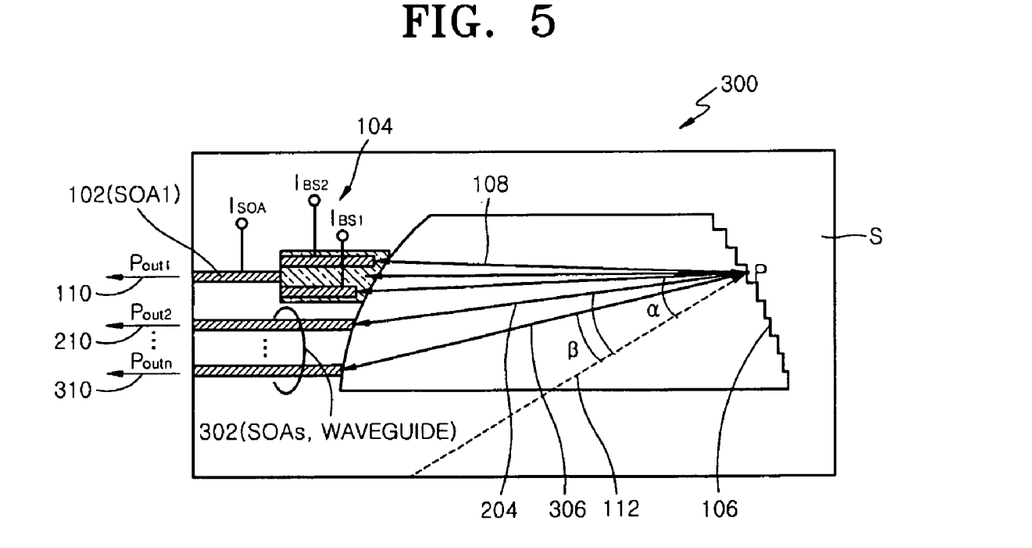
FIG. 5 is a schematic view of a wavelength tunable light source according to still another embodiment of the present invention.

FIG. 5 is a schematic view of a wavelength tunable light source according to still another embodiment of the present invention.

In detail, the wavelength tunable light source, i.e., a wavelength tunable laser, 300 of FIG. 5 is configured to satisfy the Littman condition. The wavelength tunable light source 300 of FIG. 300 includes a plurality of optical amplifiers (or waveguides) 302 additional to those of the wavelength tunable light source 200 of FIG. 4. The optical amplifiers 302 of FIG. 5 transmit or amplify beams 204 and 306 with different wavelengths according to the diffraction equation for the Littman condition to output light $P_{out2}$ 210 and $P_{outn}$ 310. That is, the additional optical amplifiers 302 resonate and emit beams with different wavelengths that correspond to channels.

Referring to FIG. 5, the channel-allocated wavelengths of the beams emitted from the optical amplifiers 302 are tuned based on current injection to the beam steering unit 104. When intervals between the channels for the respective beams emitted from the optical amplifiers 302 are maintained constant, an overall wavelength tuning variation is equal to the product of a wavelength tuning variation of one channel upon the injection of current to the beam steering unit 104 and the number of the channels. Hence, the wavelength tuning variation can be increased by the number of the channels. The second optical amplifiers 302 can output at sides thereof light $P_{out2}$ and $P_{outn}$ 310 within the wavelength tuning variation range for each channel, and the first optical amplifier 102 can output wavelengths of all the channels.

Figure 6:
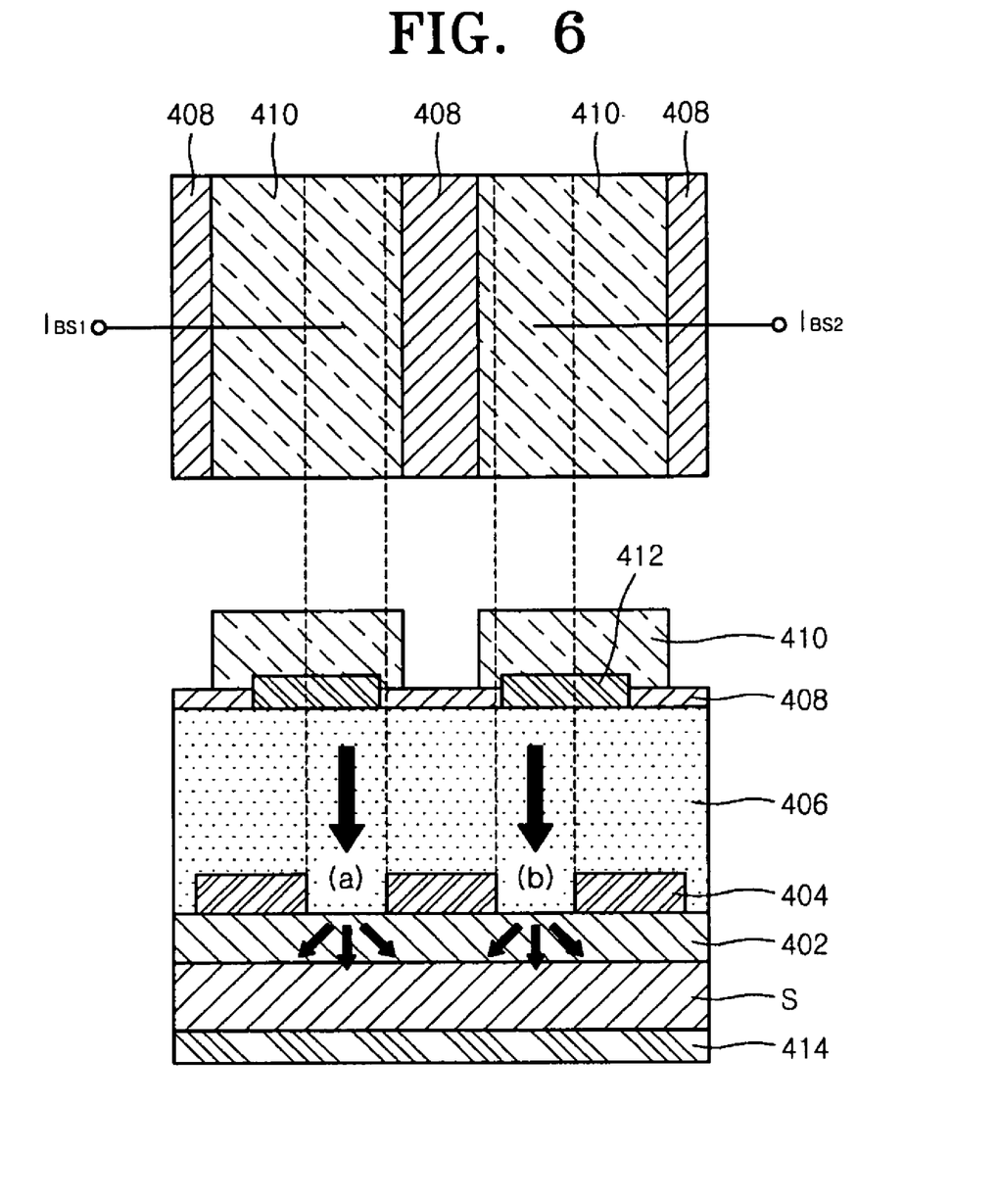
FIG. 6 is plan and sectional views of a beam steering unit usable for a wavelength tunable light source according to an embodiment of the present invention.

FIG. 6 illustrates a beam steering unit 104 usable for a wavelength tunable light source according to an embodiment of the present invention.

In detail, FIG. 6 is a plan view (upper) and a sectional view (lower) of the beam steering unit 104 usable for the wavelength tunable light source. The beam steering unit 104 uses a p-n junction waveguide structure, and includes an n-type InP substrate S, an InGaAsP guide-core layer 402, an n-type InP current-blocking layer 404, a p-type InP layer 406, a SiNx dielectric layer 408, and a p-type InGaAs layer 412, which are formed on the n-type InP substrate P. The p-type metal layer 410 and an n-type metal layer 414 are formed over and under the n-type InP substrate S, respectively.

In general, since a beam is moved toward a region where a refractive index is high and the refractive index decreases as the amount of current increases, the beam is moved toward a region where a small amount of current is injected. Accordingly, a difference between two currents, that is, $I_{BS1}$ and $I_{BS2}$, injected into the beam steering unit 104 as indicated by arrows results in a difference between refractive indices in a region (a) and a region (b), such that the path of a beam can be controlled as described later. Here, the n-type InP layer 404 current-blocking layer formed on the guide-core layer 402 causes current to pass through only the specific regions indicated by dotted lines during current injection. However, as a matter of fact, after current is injected into the guide-core layer 404, the current is slightly diffused outward due to carrier diffusion as indicated by arrows.

Figure 7:
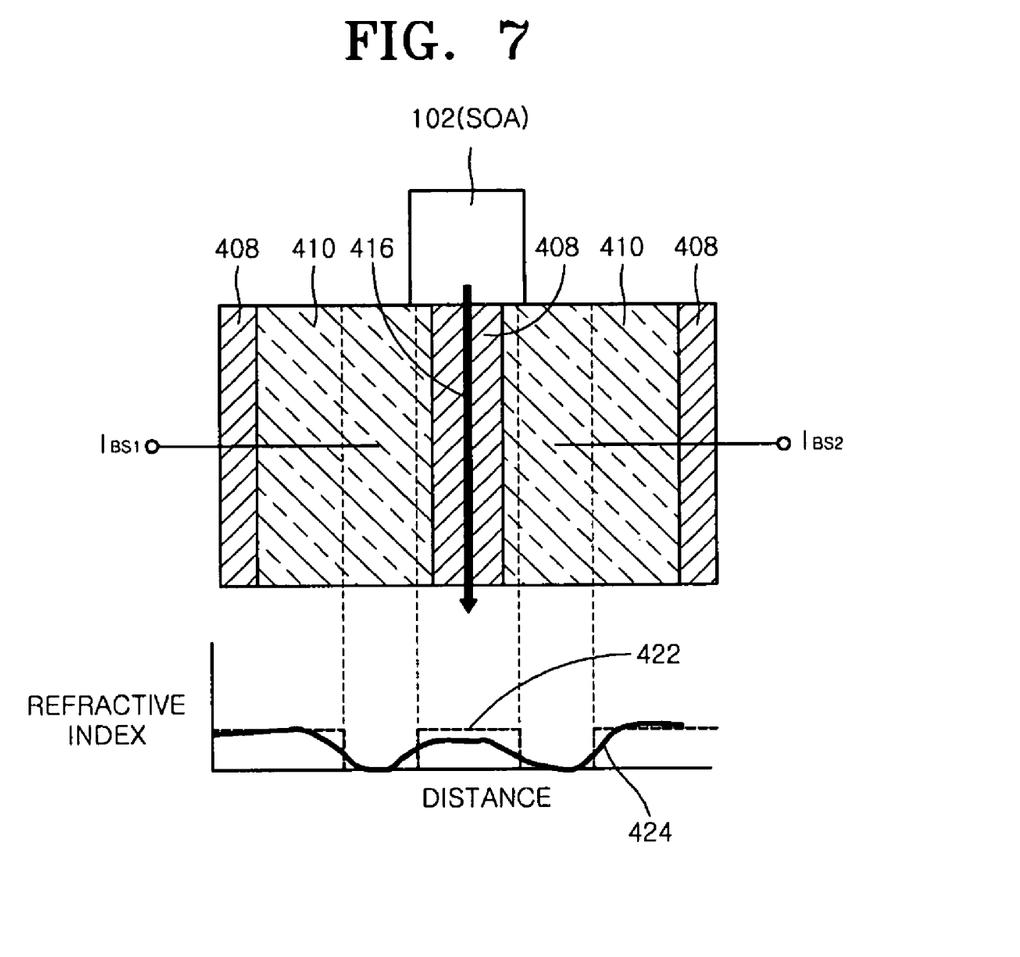
FIGS. 7 through 9 each are a plan view and a graph illustrating a relation between the refractive index of the beam steering unit of FIG. 6 and beam deflection.
Figure 8:
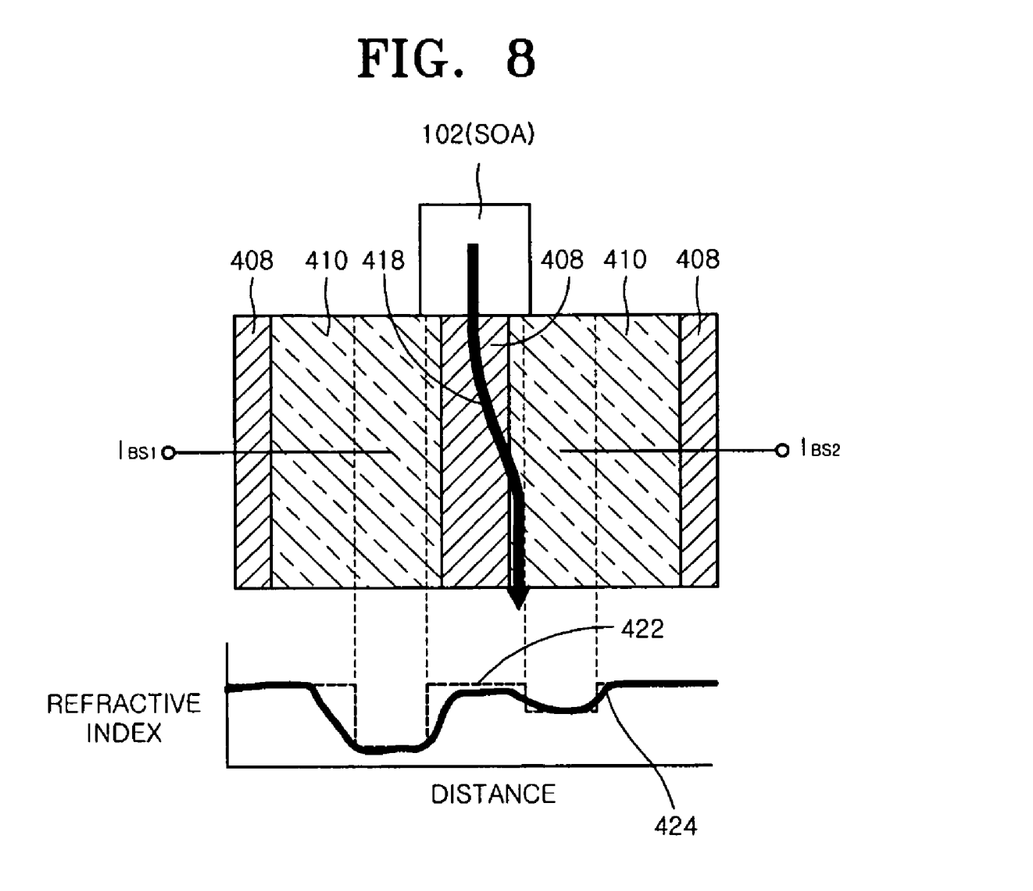
Figure 9:
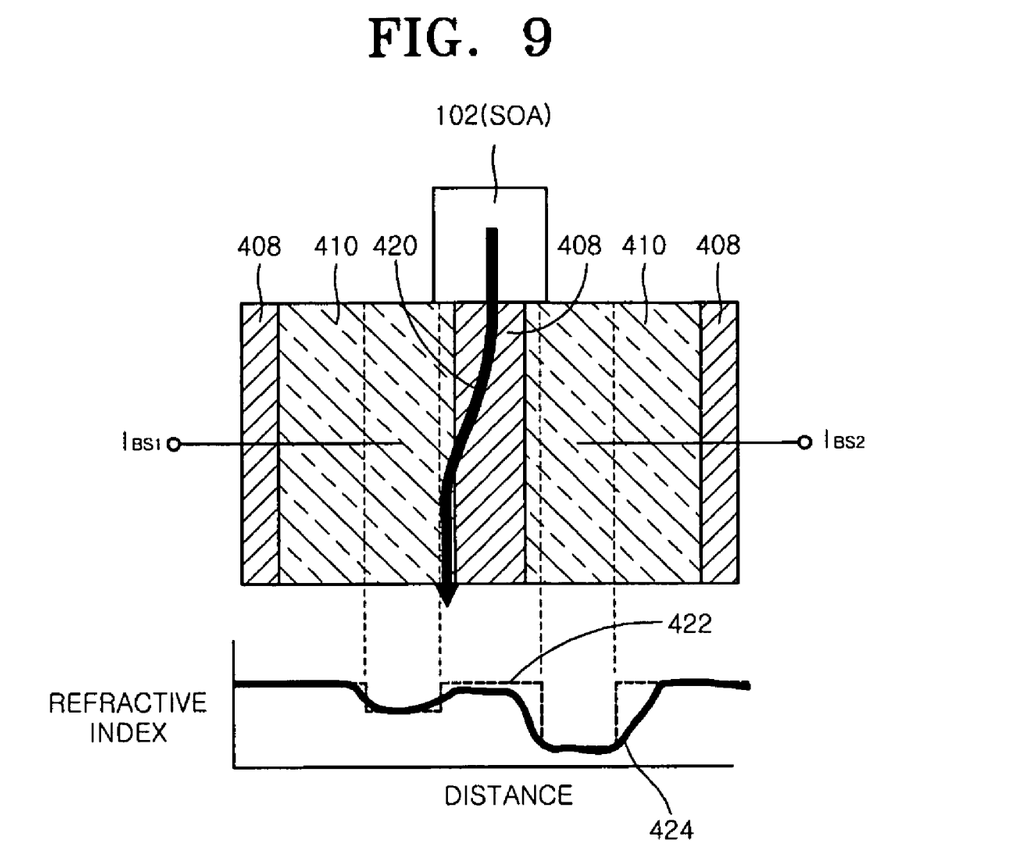

FIGS. 7 through 9 each illustrate a relation between the refractive index of the beam steering unit 104 of the wavelength tunable light source of FIG. 6 and beam movement.

In detail, FIGS. 7 through 9 each are a plan view (upper) and a graph (lower) illustrating a relation between distance and refractive index. In FIGS. 7 through 9, the same elements as those in FIG. 6 are given the same reference numerals, reference numeral 422 designates a refractive index without considering current diffusion, and reference numeral 424 designates a refractive index considering current diffusion. FIGS. 7 through 9 illustrate the movement of beams 416, 418, and 420 according to a change in the refractive index of the beam steering unit 104 upon the injection of current $I_{BS1}$ and $I_{BS2}$ when the beams 416, 418, and 420 produced by the optical amplifier 102 of the wavelength tunable light source of the present invention pass the beam steering unit 104.

That is, when the beams 416, 418, and 420 produced by the optical amplifier 102 of the wavelength tunable light source pass through the beam steering unit 104, the refractive index of the waveguide upon the injection of the currents IBS1 and IBS2 is changed and thus the path of the beams 416, 418, and 420 are changed as described above. FIG. 7 illustrates a case where the currents $I_{BS1}$ and $I_{BS2}$ are equal to each other and thus the beam 416 moves between the two electrodes. FIG. 8 illustrates a case where the current $I_{BS1}$ is greater than the current $I_{BS2}$ and thus the beam 418 is deflected toward the current $I_{BS2}$. FIG. 9 illustrates a case where the current $I_{BS2}$ is greater than the current $I_{BS1}$ and thus the beam 420 is deflected toward the current $I_{BS1}$.

Since the beam steering unit 104 according to the present invention injects current around the place where the beams 416, 418, and 420 are guided, even after the beams 416, 418, and 420 are deflected, a small change in the refractive index is resulted as indicated by reference numeral 424, which leads to low light loss. Therefore, the wavelength tunable light source of the present invention has smaller beam deflection, which corresponds to the product of the refractive index and the length of the external resonator, during current injection than a conventional optical deflector.

In other words, since the wavelength tuning light source of the present invention achieves wavelength tuning depending on the path of the beam which is small, continuous wavelength tuning can be achieved, and low light loss during current injection can lead to high output power and low output power variation. In addition, since the beam steering unit 104 of the present invention can be formed in two straight patterns, manufacturing processes are simplified, thereby obtaining high device reliability.

Figure 10:
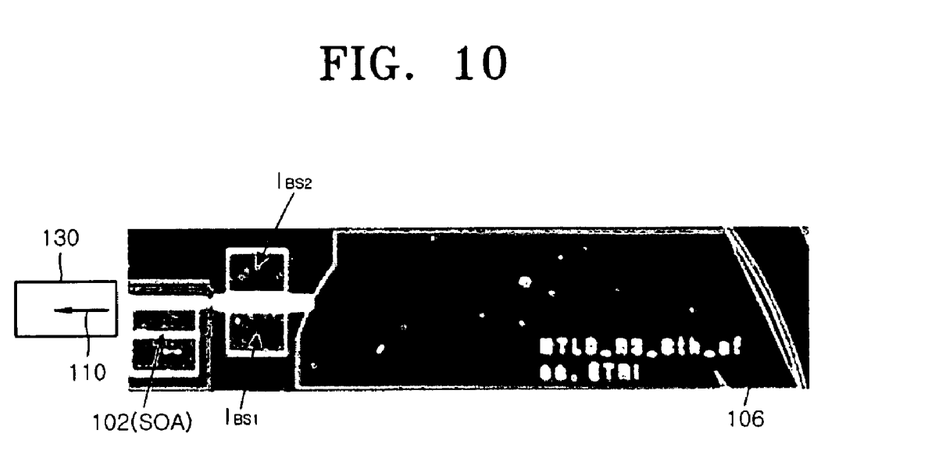
FIG. 10 is a photograph of the wavelength tunable light source of FIG. 3 provided with the beam steering unit of FIG. 6.

FIG. 10 is a photograph of the wavelength tunable light source of FIG. 3 provided with the beam steering unit 104 of FIG. 6.

In detail, the optical amplifier 102 is disposed on the left side of the substrate S, and the concave diffraction grating 106 is disposed on the right side of the substrate S. The beam steering unit 104 is adjacent to the optical amplifier 102. The two electrodes are installed in the beam steering unit 104, and currents $I_{BS1}$ and $I_{BS2}$ are applied to the two electrodes. The circle 116 around the concave diffraction grating 106 contacts a side of the beam steering unit 104, and the concave diffraction grating 106 is configured in the form of the Rowland circle 114. A beam emitted from the optical amplifier 102 is diffracted and reflected by the concave diffraction grating 106 to be output as light 110 through an optical fiber 130.

Figure 11:
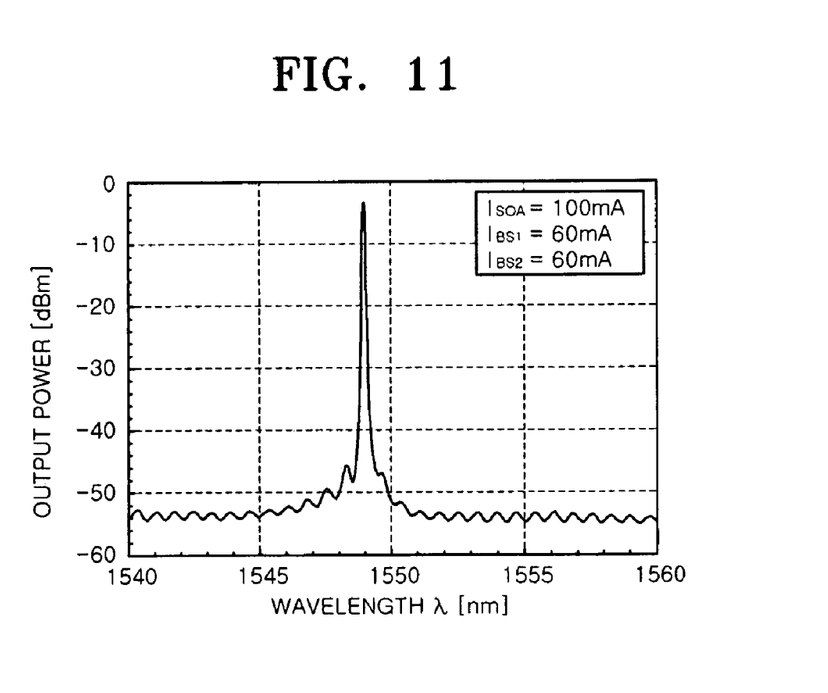
FIG. 11 is a graph illustrating an output power spectrum of the wavelength tunable light source of FIG. 10.

FIG. 11 is a graph illustrating an output power spectrum of the wavelength tunable light source of FIG. 10.

In detail, FIG. 11 illustrates the spectrum of light output through the optical fiber when current $I_{SOA}$ of 100 mA, $I_{BS1}$ of 60 mA, and $I_{BS2}$ of 60 mA are injected, respectively, to the wavelength tunable light source of FIG. 10. Referring to FIG. 11, a high side mode suppression ratio of 40 dB or more and a stable oscillation are obtained.

Figure 12:
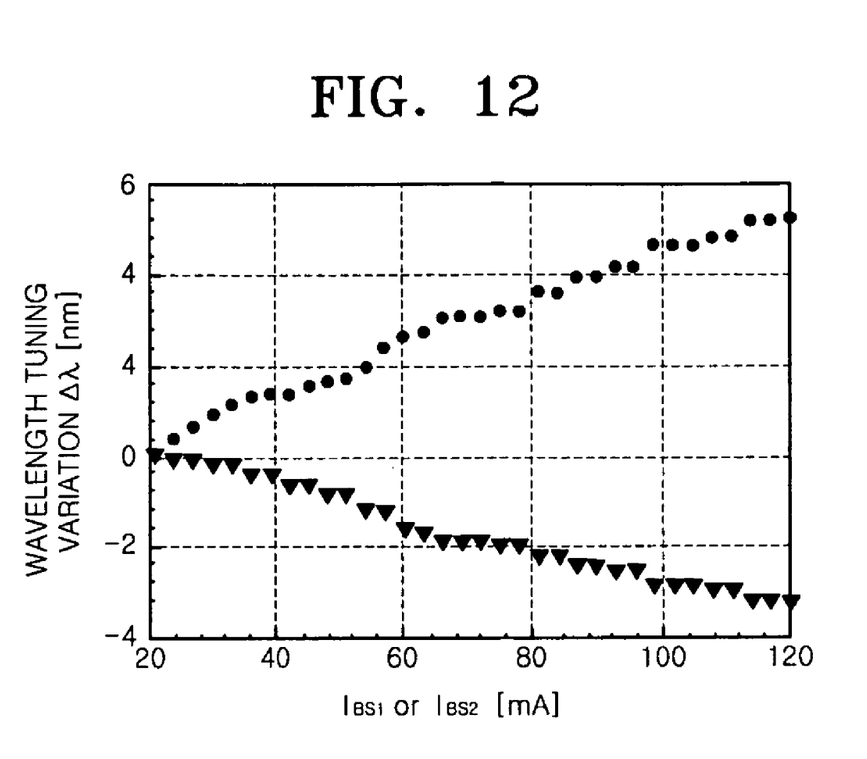
FIG. 12 is a graph illustrating wavelength tunability of the wavelength tunable light source of FIG. 10.

FIG. 12 is a graph illustrating wavelength tunability of the wavelength tunable light source of FIG. 10.

In detail, FIG. 12 illustrates wavelength tunability when $I_{SOA}$ of 80 mA is injected and either IBS1 or IBS2 is fixed to 60 mA and the other increases 20 mA to 120 mA. Referring to FIG. 12, continuous wavelength tuning is achieved and a maximum wavelength tuning variation is approximately 8.5 nm.

As described above, since the wavelength tunable light source of the present invention monolithically integrates the optical amplifier, the beam steering unit, and the concave diffraction grating, problems confronted by a conventional bulk type wavelength tuning light source, for example, additional optical elements or optical alignment, can be avoided.

Since the wavelength tunable light source of the present invention achieves wavelength tuning using a difference in the amounts of current applied to the two electrodes in the beam steering unit, the wavelength tunable light source is structurally more stable and has a more rapid wavelength tuning rate than a conventional structure that mechanically achieves wavelength tuning.

Since the wavelength tunable light source of the present invention moves a beam through the injection of electrical signals, e.g., the injection of current, to the beam steering unit, light loss due to beam deflection and current injection can be minimized and continuous wavelength tuability, high output power, and a small change in the output power can be achieved as compared with a conventional deflector.

Since the wavelength tunable light source of the present invention has the beam steering unit formed in the two straight patterns, high device reliability can be ensured and the yield of devices can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wavelength tunable light source comprising:
    an optical amplifier amplifying and outputting a beam;
    a beam steering unit moving the path of the beam output from the optical amplifier in response to an electrical signal; and
    a concave diffraction grating diffracting the beam passing through the beam steering unit and incident thereon according to the incidence angle of the beam and reflecting part of the beam with a specific wavelength,
    wherein the path of beam produced by the optical amplifier is changed by the beam steering unit when the electrical signal is applied to the beam steering unit to be incident on the concave diffraction grating, and then diffracted and reflected by the concave diffraction grating such that only the part of the beam with the specific wavelength is fed back to the beam steering unit and the optical amplifier, thereby achieving wavelength tuning.

2. The wavelength tunable light source of claim 1, wherein the optical amplifier, the beam steering unit and the concave diffraction grating are monolithically integrated on a single substrate.

3. The wavelength tunable light source of claim 1, wherein the beam steering unit is disposed between the optical amplifier and the concave diffraction grating, and changes the path of the beam due to a change in a refractive index caused by a difference between in the amounts of current applied to two electrodes installed in the beam steering unit.

4. The wavelength tunable light source of claim 3, wherein the beam steering unit comprises the two electrodes so that electrical signals can be applied to left and right sides of the path of the beam to minimize light loss and the change in the refractive index according to the path of the beam.

5. The wavelength tunable light source of claim 1, wherein the concave diffraction grating is configured in the form of Rowland circle, and the beam steering unit contacts a side of the Rowland circle.

6. A wavelength tunable light source comprising:
    a first optical amplifier amplifying and outputting a beam;
    a beam steering unit moving the path of the beam output from the first optical amplifier in response to an electrical signal;
    a concave diffraction grating diffracting the beam passing through the beam steering unit and incident thereon according to the incidence angle of the beam such that only part of the beam with a specific or plurality of wavelengths is reflected; and
    a second optical amplifier, i.e., an optical waveguide, outputting the beam with the specific or plurality of wavelengths reflected by the concave diffraction grating,
    wherein the path of the beam produced by the optical amplifier is changed by the beam steering unit when the electrical signal is applied to the beam steering unit to be incident on the concave diffraction grating, and then diffracted and reflected by the concave diffraction grating such that only the part of the beam with the specific or plurality of wavelengths is fed back to the first optical amplifier through the beam steering unit or fed back to the second optical amplifier, or an optical waveguide, thereby achieving wavelength tuning.

7. The wavelength tunable light source of claim 6, wherein a plurality of second optical amplifiers or the optical waveguide are used.

8. The wavelength tunable light source of claim 6, wherein the first optical amplifier, the beam steering unit, the concave diffraction grating, the second optical amplifier, and the optical waveguide are monolithically integrated on a single substrate.

9. The wavelength tunable light source of claim 6, wherein the beam steering unit is disposed between the optical amplifier and the concave diffraction grating, and changes the path of the beam due to a change in a refractive index caused by a difference in the amounts of current applied to two electrodes installed in the beam steering unit.

10. A wavelength tunable light source comprising:
a beam steering unit moving the path of the beam output from the optical amplifier in response to an electrical signal; and
a concave diffraction grating that is formed in Rowland circle, and diffracts and reflects the beam passing through the beam steering unit and incident thereon according to the incidence angle of the beam such that part of the beam with a specific wavelength is reflected,
wherein the path of the beam produced by the optical amplifier is changed by the beam steering unit when the electrical signal is applied to the beam steering unit to be incident on a pole of the concave diffraction grating where a full circle formed around the concave diffraction grating and the Rowland circle intersect, and then diffracted and reflected by the concave diffraction grating such that only the part of the beam with the specific wavelength is fed back through the beam steering unit to the optical amplifier, thereby achieving wavelength tuning according to a diffraction grating equation for the Littrow condition.

11. The wavelength tunable light source of claim 10, wherein the diffraction grating equation for the Littrow condition is defined by $$m\lambda = 2n_1 d \sin\theta$$

where m is the diffraction order, $\lambda$ is the wavelength, $n_1$ is the refractive index of a waveguide layer, d is the period of the concave diffraction grating, $\theta$ is the incidence angle between the beam incident on the concave diffraction grating and a reference line that extends from the center of the full circle formed around the concave diffraction grating to the pole.

12. A wavelength tunable light source comprising:
a first optical amplifier amplifying and outputting a beam;
a beam steering unit moving the path of the beam output from the first optical amplifier in response to an electrical signal;
a concave diffraction grating that is formed in Rowland circle and diffracts the beam passing through the beam steering unit and incident thereon according to the incidence angle of the beam such that part of the beam with a specific or plurality of wavelengths is reflected; and
a second optical amplifier, i.e., an optical waveguide, outputting the beam with the specific or plurality of wavelengths reflected by the concave diffraction grating,
wherein the path of the beam produced by the optical amplifier is changed by the beam steering unit when the electrical signal is applied to the beam steering unit to be incident on a pole of the concave diffraction grating where a full circle formed around the concave diffraction grating and the Rowland circle intersect, and then diffracted and reflected by the concave diffraction grating such that only the part of the beam with the specific or plurality of wavelengths is fed back to the first optical amplifier through the beam steering unit to achieve wavelength tuning or fed back to the second optical amplifier or an optical waveguide to achieve wavelength tuning according to a diffraction grating equation for the Littman condition.

13. The wavelength tunable light source of claim 12, wherein the diffraction grating equation for the Littman condition is defined by $$m\lambda = 2n_1 d(\sin\alpha + \sin\beta)$$

where m is the diffraction order, $\lambda$ is the wavelength, $n_1$ is the refractive index of a waveguide layer, d is the period of the concave diffraction grating, $\alpha$ is the incidence angle between the beam incident on the concave diffraction grating and a reference line that extends from the center of a full circle formed around the concave diffraction grating to the pole, and $\beta$ is the diffraction angle between the reference line and the part of the beam reflected to the second optical amplifier or the optical waveguide.

* * * * *